(12) United States Patent
Oelmaier

(10) Patent No.: US 8,004,353 B2
(45) Date of Patent: Aug. 23, 2011

(54) CIRCUIT

(75) Inventor: Reinhard Oelmaier, Laupheim (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/616,047

(22) Filed: Nov. 10, 2009

(65) Prior Publication Data

US 2010/0117735 A1    May 13, 2010

(30) Foreign Application Priority Data

Nov. 10, 2008  (DE) .................... 10 2008 056 562

(51) Int. Cl.
*H03F 1/02*         (2006.01)
(52) U.S. Cl. ............... 330/9; 330/51; 330/253; 330/254
(58) Field of Classification Search ................ 330/9, 51, 330/253, 254
See application file for complete search history.

(56) References Cited

U.S. PATENT DOCUMENTS

| | | | | |
|---|---|---|---|---|
| 4,884,039 A * | 11/1989 | King et al. | ..................... | 330/253 |
| 4,987,327 A * | 1/1991 | Fernandez et al. | ............ | 327/543 |
| 5,079,515 A | 1/1992 | Tanimoto | | |
| 5,258,664 A | 11/1993 | White | | |
| 5,764,103 A * | 6/1998 | Burra et al. | ..................... | 330/51 |
| 5,789,974 A * | 8/1998 | Ferguson et al. | ................. | 330/2 |
| 6,373,337 B1 | 4/2002 | Ganser | | |
| 6,586,990 B2 * | 7/2003 | Udo et al. | ......................... | 330/9 |
| 7,176,910 B2 * | 2/2007 | Tsuchi | ........................... | 345/204 |
| 7,420,410 B2 * | 9/2008 | Ohba | ................................. | 330/9 |
| 7,501,887 B2 | 3/2009 | Stephelbauer et al. | | |
| 2009/0219103 A1 | 9/2009 | Kriebernegg | | |

FOREIGN PATENT DOCUMENTS

| | | |
|---|---|---|
| DE | 42 92 255 T1 | 7/1993 |
| DE | 40 38 217 C2 | 8/1993 |
| DE | 10 2005 008 507 A1 | 8/2006 |
| EP | 0 400 650 B1 | 10/1996 |
| EP | 1067679 A2 | 1/2001 |
| WO | WO 2007/101708 A1 | 9/2007 |

\* cited by examiner

*Primary Examiner* — Patricia Nguyen
(74) *Attorney, Agent, or Firm* — Baker Botts L.L.P.

(57) ABSTRACT

A circuit and an adjusting method with a differential amplifier and with a control circuit, wherein the differential amplifier has a first amplifier transistor which for amplifying an input signal of the differential amplifier is connected in a first branch of the differential amplifier, wherein the differential amplifier has a second amplifier transistor which for amplifying the input signal of the differential amplifier is connected in a second branch of the differential amplifier, wherein the differential amplifier has at least one first series connection with a first transistor and a first semiconductor switch, the amplifier being connected parallel to the first amplifier transistor, wherein the differential amplifier has at least one second series connection with a second transistor and a second semiconductor switch, the amplifier being connected in parallel to the second amplifier transistor, and wherein the control circuit is connected to the switch inputs of the semiconductor switches to control the switching states of the semiconductor switches.

16 Claims, 2 Drawing Sheets

CIRCUIT

This nonprovisional application claims priority under 35 U.S.C. §119(a) to German Patent Application No. 10 2008 056 562.8, which was filed in Germany on Nov. 10, 2008, and which is herein incorporated by reference.

BACKGROUND OF THE INVENTION

1. Field of the Invention

The present invention relates to an integrated circuit.

2. Description of the Background Art

WO/2007/101708, which corresponds to U.S. Publication No. 20090219103, discloses an oscillator arrangement, comprising a differential amplifier and a first and second terminal. The current driving capability of the transistors in the first branch is equal to the current driving capability of the transistors in the second branch of the differential amplifier, so that the differential amplifier has a symmetric configuration.

A linearized differential amplifier is known from EP 0 400 650 B1, which corresponds to U.S. Pat. No. 5,079,515. In DE 40 38 217 C2, an input voltage region is increased by means of offset voltage sources of a differential amplifier. DE 42 92 255, which corresponds to U.S. Pat. No. 5,258,664, T1 discloses an operational amplifier with a sample-and-hold device and with automatic zeroing.

SUMMARY OF THE INVENTION

It is therefore an object of the present invention to improve a circuit with a differential amplifier as much as possible. Accordingly, a circuit is provided which can be monolithically integrated on a semiconductor chip. The circuit has a differential amplifier and a control circuit. The differential amplifier has a first branch with at least one first amplifier transistor and a second branch with at least one second amplifier transistor. In an embodiment, both branches of the differential amplifier have a symmetric configuration.

To amplify an input signal, the first amplifier transistor in the first branch and the second amplifier transistor in the second branch are connected to the inputs of the differential amplifier. The differential amplifier has an inverting and a non-inverting input. Preferably, the first amplifier transistor and the second amplifier transistor are formed as field-effect transistors. Advantageously, a control input (gate/source) of the first amplifier transistor is connected directly to a first input of the differential amplifier or indirectly via an impedance. Advantageously, a control input (gate/source) of the second amplifier transistor is connected directly to a second input of the differential amplifier or indirectly via an impedance.

The differential amplifier has at least one first series connection with a first transistor and a first semiconductor switch. The first series connection is connected parallel to the first amplifier transistor. The first transistor is preferably a field-effect transistor, which has a smaller gate width than the first amplifier transistor. A source-drain path of the first transistor can be connected parallel to a source-drain path of the first amplifier transistor by means of the first semiconductor switch, in order to increase the amplification in this branch of the differential amplifier.

The differential amplifier has at least one second series connection with a second transistor and a second semiconductor switch. The second series connection is connected parallel to the second amplifier transistor. The second transistor is preferably a field-effect transistor, which has a smaller gate width than the second amplifier transistor. A source-drain path of the second transistor can be connected parallel to a source-drain path of the second amplifier transistor by means of the second semiconductor switch, in order to increase the amplification in this second branch of the differential amplifier.

The control circuit is connected to the switch inputs of the semiconductor switches to control the switching states of the semiconductor switches. For example, the semiconductor switches are formed as field-effect transistors or bipolar transistors. The control circuit is connected, for example, to the gate terminals of the field-effect transistors as semiconductor switches. The control circuit is set up to adjust an offset output voltage of the differential amplifier. To adjust the offset output voltage, the control circuit is set up to control the switching states of the first semiconductor switch in the first series connection comprising the first transistor and the first semiconductor switch and the second semiconductor switch in the second series connection comprising the second transistor and the second semiconductor switch.

The object of the invention furthermore is to provide as improved a method as possible. Accordingly, a method is provided for adjusting an offset output voltage of a differential amplifier. In the method, an output voltage of the differential amplifier is measured. To adjust the offset output voltage, a first transistor is connected parallel to a first amplifier transistor in a first branch of the differential amplifier to change the amplification by means of a first semiconductor switch. Alternatively or in combination, to adjust the offset output voltage, a second transistor is connected parallel to a second amplifier transistor in a second branch of the differential amplifier to change the amplification by means of a second semiconductor switch. In this way, an offset output voltage can be increased or decreased. If, for example, the offset output voltage at the drain terminal of the first amplifier transistor is to be reduced, the amplification in the same branch of the differential amplifier is increased, in that to increase the amplification, the first transistor is connected parallel to the first amplifier transistor. If, for example, the offset output voltage at the drain terminal of the first amplifier transistor is to be increased, the amplification in another branch of the differential amplifier is increased, in that to increase the amplification, the second transistor is connected parallel to the second amplifier transistor.

The refinements described hereinafter relate to the circuit and to the method. Methods features emerge from the functions of the circuit. Functions of the circuit can be derived from the methods features.

The control circuit can have a memory for storing the switching states. The memory is, for example, a register or formed by several flip-flops. It is also possible to form the memory as fuses, which are separated to adjust the switching states by currents.

It is possible to adjust a reduction of the amount of the offset output voltage. The adjustment can occur, for example, by means of programming of the control circuit memory.

The overall amplification of the differential amplifier is affected only marginally by the adjustment of the offset output voltage. The effect is achieved that production differences in the two amplifier branches or the external wiring thereof are compensated at least partially by the additional connection of parallel amplifiers in the series connections. This occurs by the direct connection of amplifier transistors in one or both amplifier branches. The offset output voltage can therefore be compensated by a specifically adjusted asymmetry of a symmetric circuit.

According to an embodiment, a control terminal of the first transistor of the first series connection can be or is directly connected to the control terminal of the first amplifier transistor by a switch. Therefore, the same signal is preferably applied at the first transistor as at the first amplifier transistor. According to an advantageous refinement variant, a control terminal of the second transistor of the second series connection can be or is directly connected to the control terminal of the second amplifier transistor by the switch. Therefore, the same signal is preferably applied at the second transistor as at the second amplifier transistor.

In a first embodiment variant, it is provided advantageously that the differential amplifier has a plurality of first series connections comprising in each case a transistor and a semiconductor switch. Each first series connection can be connected parallel to the first amplifier transistor.

In a second, likewise combinable, embodiment, it is provided that the differential amplifier can have a plurality of second series connections comprising in each case a transistor and a semiconductor switch. Each second series connection is connected parallel to the second amplifier transistor.

An embodiment provides that gate widths of the transistors in the first series connections are configured differently. A refinement provides that gate widths of the transistors in the second series connections are configured differently. It is also advantageous to configure the gate widths of the transistors in the first and second series connection different from one another, so that smaller increments can be adjusted by simultaneous parallel connection of transistors in the first and second branch of the differential amplifier.

The difference in the gate widths of at least two transistors in the first series connection is smaller than the smallest structural width, particularly smaller than the smallest gate width that can be produced by the employed technology. The parallel connection of two transistors with a slightly different gate width in the first branch and in the second branch of the differential amplifier enables an especially finely resolved adjusting of the offset voltage. The smallest structural width in this case is determined by the manufacturing process, particularly by the employed lithography. The difference in the gate widths of at least two transistors in the second series connection is advantageously also smaller than the smallest structural width.

According to an embodiment, a first input of the differential amplifier is connected to a bandgap reference voltage source. To generate a certain output voltage of the differential amplifier, a second input of the differential amplifier is connected to a feedback network to form a control loop. The control circuit is preferably set up to change the output voltage of the differential amplifier.

Another embodiment provides that a drain terminal of the first transistor in the series connection is connected to a drain terminal of the first amplifier transistor. Alternatively, it can be provided that a source terminal of the first transistor in the series connection is connected to a source terminal of the first amplifier transistor.

In another embodiment, a drain terminal of the second transistor in the series connection is connected to a drain terminal of the second amplifier transistor. According to an advantageous alternative, a source terminal of the second transistor in the series connection is connected to a source terminal of the second amplifier transistor.

It is provided according to an embodiment that each first series connection has an additional first semiconductor switch. The series connection therefore has the first semiconductor switch, the first transistor, and the additional first semiconductor switch in series. Preferably, the first transistor is connected between the first semiconductor switch and the additional first semiconductor switch. Preferably, both the drain terminal and the source terminal of the first transistor can be separated from the first amplifier transistor by the first semiconductor switch or the additional first semiconductor switch, respectively.

It is provided according to another embodiment that each first series connection has an additional first semiconductor switch. The first series connection therefore has the first semiconductor switch, the first transistor, and the additional first semiconductor switch in series. Preferably, the first transistor is connected between the first semiconductor switch and the additional first semiconductor switch. Preferably, both the drain terminal and the source terminal of the first transistor can be separated from the first amplifier transistor by the first semiconductor switch or the additional first semiconductor switch, respectively.

It is provided according to another embodiment that each second series connection has an additional second semiconductor switch. The second series connection therefore has the second semiconductor switch, the second transistor, and the additional second semiconductor switch in series. The second transistor is connected between the second semiconductor switch and the additional second semiconductor switch. Preferably, both the drain terminal and the source terminal of the second transistor can be separated from the second amplifier transistor by the second semiconductor switch or the additional second semiconductor switch, respectively.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
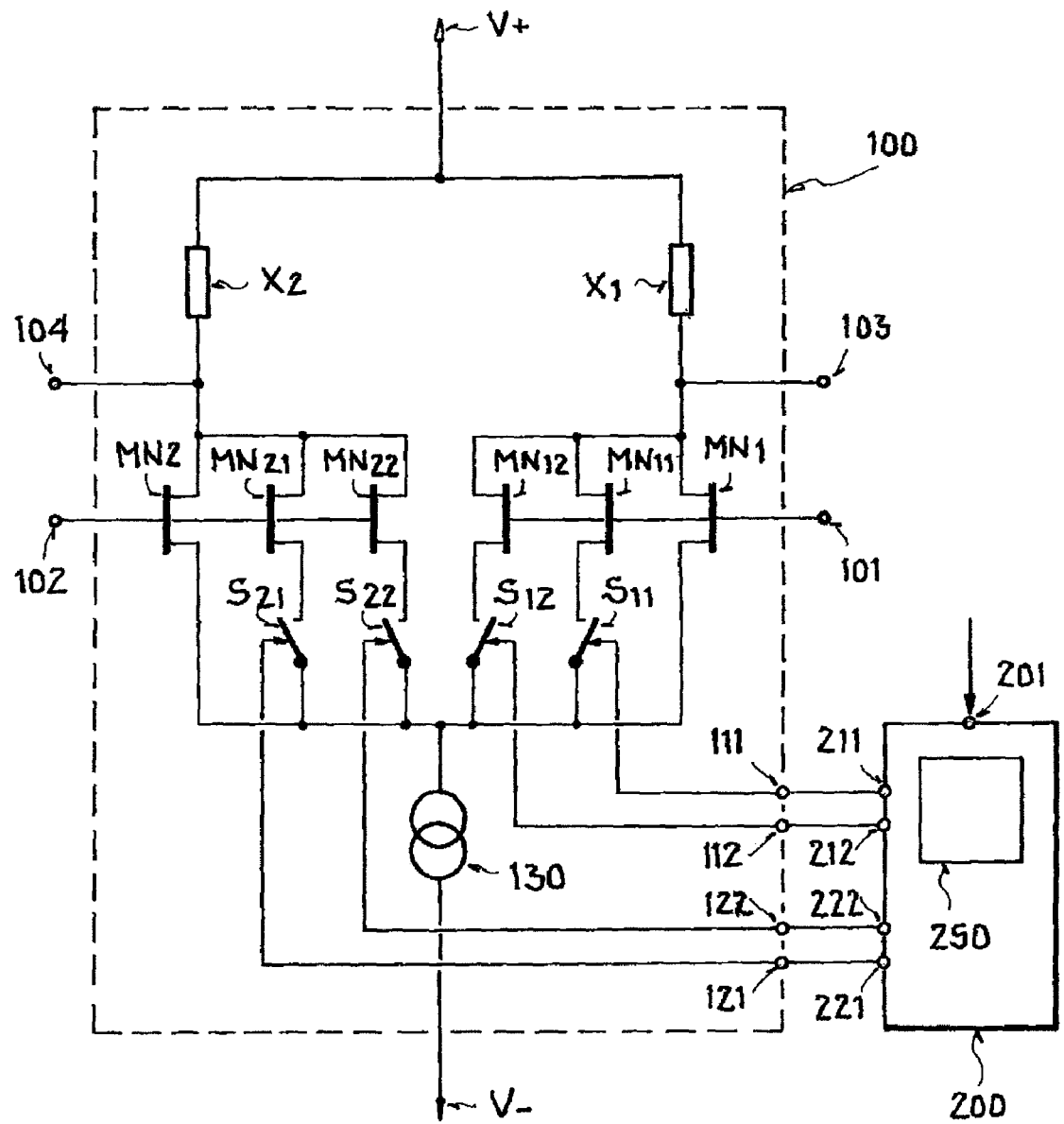
FIG. 1 is a schematic circuit diagram of a first exemplary embodiment.

A circuit diagram of a circuit with a differential amplifier 100, connected to the supply voltages V+ and V−, and a control circuit 200 are shown schematically in FIG. 1. The differential amplifier has a first branch with a first NMOS field-effect transistor MN1 and a first load X1. To amplify an input signal at a first input 101, the first NMOS field-effect transistor MN1 is connected to first input 101, first load X1, and a current drain 130.

The differential amplifier has a second branch with a second NMOS field-effect transistor MN2 and a second load X2. To amplify an input signal at a second input 102, the second NMOS field-effect transistor MN2 is connected to second input 102, second load X2, and a current drain 130.

The first load X1 and the second load X2 are, for example, an impedance, such as an ohmic resistor or an inductor, or an active load, such as, for example, a current source. In the exemplary embodiment of FIG. 1, in each case an output 103, 104 of differential amplifier 100 is connected to the first load X1 and to the second load X2. Current drain 130 defines the sum of currents through the two branches of differential amplifier 100 in the case of an unloaded output.

In the ideal case, the first NMOS field-effect transistor MN1 and the second NMOS field-effect transistor MN2 are precisely the same, so that the current through the current drain divides into equal parts to NMOS field-effect transistors MN1 and MN2. In the case of loads X1 and X2, identical in this ideal case, the output voltages at outputs 103 and 104 are also identical.

Because of fabrication variations, NMOS field-effect transistors MN1 and MN2 can be dissimilar and have, for example, a dissimilar geometry, dissimilar threshold voltage, or a dissimilar transconductance coefficient. These dissimilarities cause a difference in the output voltage at outputs 103 and 104, when the input voltages at inputs 101 and 102 are identical. The difference between the output voltages is also called the offset voltage.

To adjust the offset voltage, in the exemplary embodiment of FIG. 1, NMOS field-effect transistors MN11 and MN12 are provided in the first branch of differential amplifier 100, whereby the control inputs (gates) of NMOS field-effect transistors MN11 and MN12 are connected to amplifier transistor MN1. A semiconductor switch S11, S12 is connected in series to each NMOS field-effect transistors MN11 and MN12. This series connection comprising NMOS field-effect transistor MN11 and semiconductor switches S11 (or MN12 and S12, respectively) is connected parallel to amplifier transistor MN1. In the exemplary embodiment of FIG. 1, semiconductor switch S11, S12 connects the source terminal of the respective NMOS field-effect transistor MN11, MN12 to the source terminal of amplifier transistor MN1. In the connected state, therefore, the respective NMOS field-effect transistors MN11, MN12 are connected parallel to amplifier transistor MN1 and change the amplification of the first branch of differential amplifier 100.

Amplifier transistor MN1 and NMOS field-effect transistors MN11 and MN12 in this case can have the same gate lengths within the scope of fabrication variations. Advantageously, the gate width of amplifier transistor MN1 is larger by at least the factor 10 than the gate widths of NMOS field-effect transistors MN11 and MN12. The gate widths of NMOS field-effect transistors MN11 and MN12 in this case are the same or larger than the smallest structural width achievable in the manufacturing process. The smallest structural width in this case is determined particularly by a lithography process.

The second branch of differential amplifier 100 in the exemplary embodiment of FIG. 1 is formed symmetric to the first branch. Differential amplifier 100, 100' has two second series connections each comprising a second NMOS field-effect transistor MN21 and MN22 and a second semiconductor switch S21 and S22, respectively. The second series connections are connected parallel to second amplifier transistor MN2.

The offset voltage can be changed with the circuit shown in the exemplary embodiment of FIG. 1. If, for example, amplifier transistor MN1 has a too low conductivity in comparison with amplifier transistor MN2, one or more transistors MN11, MN12 are connected parallel to amplifier transistor MN1. As a result, the parallel-connected transistors MN1, MN11, MN12 act as a transistor with an increased gate width, or with an increased conductivity. This can also be achieved in the second branch of differential amplifier 100 by parallel connection of transistors MN21 and MN22 to amplifier transistor MN2.

To design the circuit as programmable, transistors MN11, MN12, MN21, MN22 can be connected or disconnected by series-connected semiconductor switches S11, S12, S21, or S22, respectively. Control circuit 200 is connected to the switch inputs of the semiconductor switches S11, S12, S21, S22 to control the switching states of the semiconductor switches S11, S12, S21, S22. To this end, the differential amplifier has control inputs 111, 112, 121, 122, which are connected to control outputs 211, 212, 221, 222 of control circuit 200. Control circuit 200 has a memory 250 for storing the switching states of semiconductor switches S11, S12, S21, S22. Control circuit 200 has an analog or digital input 201. Said input 201 can be connected as an analog input, for example, to at least one output 103 and/or 104 for measuring the output voltage or offset voltage of differential amplifier 100 (not shown in FIG. 1). Alternatively, input 201 is a digital interface for programming the memory by means of an additional circuit (not shown in FIG. 1).

The exemplary embodiment of FIG. 1 achieves the advantage that fabrication variations during the manufacture of CMOS circuits can be corrected on chip during operation or during the application by a programmable circuit. A precisely adjustable DC correction voltage (bias voltage), to be applied externally, in contrast, is not necessary. The overall amplification of the differential amplifier is influenced only marginally by the adjustment of the offset output voltage. To adjust the offset output voltage, therefore, the new basic principle is applied to compensate for the offset output voltage by the specifically adjusted asymmetry of the amplification in both branches of the amplifier.

Figure 2:
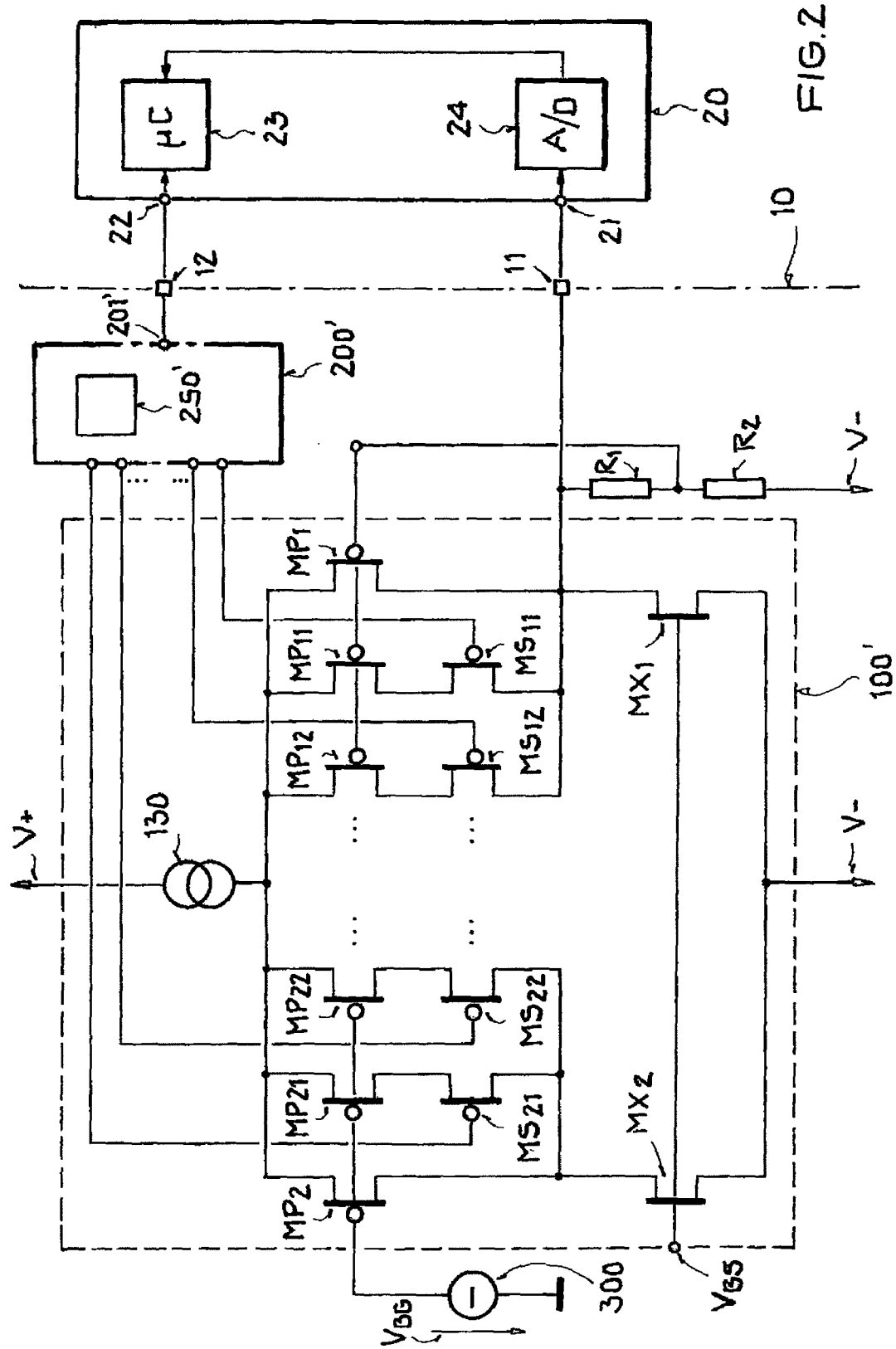
FIG. 2 is a schematic circuit diagram of a second exemplary embodiment.

Another exemplary embodiment of a circuit with a differential amplifier 100' and a control circuit 200' is shown as a schematic circuit diagram in FIG. 2. In the exemplary embodiment of FIG. 2, amplifier transistors MP1, MP2 in each branch of differential amplifier 100' are formed as PMOS field-effect transistors MP1, MP2. PMOS field-effect transistors MS11, MS12, MS21, MS22, whose gates are connected to control circuit 200', are provided as semiconductor switches. Control circuit 200' has a register 250' for storing the switching states of semiconductor switches MS11, MS12, MS21, MS22. Semiconductor switches MS11, MS12, MS21, MS22 are connected in series with PMOS field-effect transistors MP11, MP12, MP21, or MP22, respectively, and to change the offset voltage connected to the respective amplifier transistor MP1, MP2.

An NMOS transistor MX1, connected as a current drain by means of a bias voltage VBS, is connected to first amplifier transistor MP1 as a first load MX1. An NMOS transistor MX2, connected as a current drain by means of the bias voltage VBS, is connected to second amplifier transistor MP2 as a second load MX2. The source terminals of both amplifier transistors MP1 and MP2 are connected to current source 130.

In addition to differential amplifier 100' and control circuit 200', a bandgap reference voltage source 300 and a voltage divider comprising resistors R1 and R2 are integrated in semiconductor chip 10. Bandgap reference voltage source 300 in this case generates the voltage VBG and is connected to a non-inverting input of differential amplifier 100'. The other inverting input of differential amplifier 100' is connected to the center tap of voltage divider R1, R2. Differential amplifier 100' together with resistors R1 and R2 therefore forms a control loop to control the output voltage as a function of the reference voltage of bandgap reference voltage source 300. Bandgap reference voltage source 300, differential amplifier 100', and voltage divider R1, R2 in a feedback path provide an output voltage that deviates from the reference voltage VBG of bandgap reference voltage source 300.

The output voltage of differential amplifier 100' is measurable at terminal 11, for example, a pad, of semiconductor chip 10. It is shown in FIG. 2 that a measuring device 20 with an analog input 21 is connected to terminal 11 to measure the output voltage. The output voltage is converted by an analog-to-digital converter 24 of measuring device 20 into a digital signal and supplied to arithmetic logic unit 23, for example, a microcontroller. Arithmetic logic unit 24 is connected via a digital output 22 to terminal 12 of semiconductor chip 10 and via said terminal to digital input 201' of control circuit 200' to adjust the switching states of semiconductor switches MS11, MS12, MS21, MS22. Control circuit 250' in this case retains the control signals for semiconductor switches MS11, MS12, MS21, MS22 stored in the register 250', when measuring device 20 is separated from terminals 11, 12 of semiconductor chip 10.

The output voltage of the circuit in FIG. 2 can be adjusted by means of the changes in the offset voltage of differential amplifier 100' in small steps by the switching on or off of PMOS field-effect transistors MP11, MP12, MP21, MP22, so that fabrication variations of both bandgap reference voltage source 300 and differential amplifier 100', as well as of feedback network R1, R2, can be advantageously taken into account.

The invention is not limited to the shown embodiment variants in FIGS. 1 and 2. For example, it is possible to provide two-stage or multi-stage differential amplifiers. The amplification of at least one transistor in one of the stages can be changed in this case, according to the exemplary embodiment of FIG. 1 or 2, by parallel connection of transistors to adjust the offset voltage. It is also possible to separate both the drain terminals and the source terminals by separate semiconductor switches, to reduce the active parasitic capacitances of separated transistors. It is also possible to use other transistor types, such as, for example, junction field-effect transistors. The resolution of the adjusting of the offset voltage can be achieved advantageously with a greater number of parallel switchable transistors.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   a control circuit; and
   a differential amplifier comprising:
      a first amplifier transistor configured to amplify an input signal of the differential amplifier, the first amplifier transistor being connectable in a first branch of the differential amplifier;
      a second amplifier transistor configured to amplify the input signal of the differential amplifier, the second amplifier transistor being connectable in a second branch of the differential amplifier;
      at least one first series connection having a first transistor and a first semiconductor switch, the first series connection being connected in parallel to the first amplifier transistor; and
      at least one second series connection having a second transistor and a second semiconductor switch, the second series connection being connected in parallel to the second amplifier transistor, wherein the control circuit is connectable to switch inputs of the first and second semiconductor switches,
   wherein the control circuit is configured to control switching states of the first and second semiconductor switches, and
   wherein the control circuit is configured to adjust an offset output voltage of the differential amplifier by a control of the switching states of the first and second semiconductor switches.

2. The circuit according to claim 1, wherein the control circuit has a memory and is configured to store the switching states.

3. The circuit according to claim 1, wherein a control terminal of the first transistor of the first series connection is directly connected to a control terminal of the first amplifier transistor, or wherein a control terminal of the second transistor of the second series connection is directly connected to a control terminal of the second amplifier transistor.

4. The circuit according to claim 1, wherein the differential amplifier has a plurality of first series connections comprising in each case a transistor and a semiconductor switch, each first series connection being connected in parallel to the first amplifier transistor, or wherein the differential amplifier has a plurality of second series connections comprising in each case a transistor and a semiconductor switch, each second series connection being connected in parallel to the second amplifier transistor.

5. The circuit according to claim 4, wherein gate widths of the transistors of the first series connections are configured differently, and/or wherein gate widths of the transistors of the second series connections are configured differently.

6. The circuit according to claim 5, wherein a difference in the gate widths of at least two transistors in the first series connection is smaller than a smallest gate width of the circuit, or wherein a difference in the gate widths of at least two transistors in the second series connection is smaller than a smallest gate width of the circuit.

7. The circuit according to claim 1, wherein a first input of the differential amplifier is connectable to a bandgap reference voltage source, wherein a second input of the differential amplifier is connectable to a feedback network to generate an output voltage of the differential amplifier, and wherein the control circuit is configured to change an output voltage of the differential amplifier.

8. The circuit according to claim 1, wherein a drain terminal of the first transistor in the series connection is connectable to a drain terminal of the first amplifier transistor or a source terminal of the first transistor in the series connection is connectable to a source terminal of the first amplifier transistor, or wherein a drain terminal of the second transistor in the series connection is connectable to a drain terminal of the second amplifier transistor or a source terminal of the second transistor in the series connection is connectable to a source terminal of the second amplifier transistor.

9. The circuit according to claim 1, wherein each first series connection has an additional first semiconductor switch, wherein the first transistor is connected between the first semiconductor switch and the additional first semiconductor switch, or wherein each second series connection has an additional second semiconductor switch, wherein the second transistor is connectable between the second semiconductor switch and the additional second semiconductor switch.

10. A method for adjusting an offset output voltage of a differential amplifier, the method comprising:
    measuring an output voltage of the differential amplifier for an adjustment of the offset output voltage; and to adjust the offset output voltage, connecting a first transistor parallel to a first amplifier transistor in a first branch of the differential amplifier to change the amplification by a first semiconductor switch and/or connecting a second transistor parallel to a second amplifier transistor in a second branch of the differential amplifier to change the amplification by a second semiconductor switch, wherein a control terminal of the first transistor of the first series connection is connectable to a control terminal of the first amplifier transistor by a first switch, or wherein a control terminal of the second transistor of the second series connection is connectable to a control terminal of the second amplifier transistor by a second switch.

11. A circuit comprising:
a control circuit; and
a differential amplifier comprising:
- a first amplifier transistor amplifying a first input signal of the differential amplifier;
- a second amplifier transistor amplifying a second input signal of the differential amplifier;
- at least one first series connection having a first transistor and a first semiconductor switch, the first series connection being connected in parallel to the first amplifier transistor; and
- at least one second series connection having a second transistor and a second semiconductor switch, the second series connection being connected in parallel to the second amplifier transistor, wherein the control circuit is configured to adjust an offset output voltage of the differential amplifier by a control of the switching states of the first and second semiconductor switches.

12. The circuit according to claim 11, wherein the control circuit has a memory and is configured to store the switching states.

13. The circuit according to claim 11, wherein a control terminal of the first transistor of the first series connection is directly connected to a control terminal of the first amplifier transistor, or wherein a control terminal of the second transistor of the second series connection is directly connected to a control terminal of the second amplifier transistor.

14. The circuit according to claim 11, wherein the differential amplifier has a plurality of first series connections comprising in each case a transistor and a semiconductor switch, each first series connection being connected in parallel to the first amplifier transistor, or wherein the differential amplifier has a plurality of second series connections comprising in each case a transistor and a semiconductor switch, each second series connection being connected in parallel to the second amplifier transistor.

15. The circuit according to claim 11, wherein a first input of the differential amplifier is connectable to a bandgap reference voltage source, wherein a second input of the differential amplifier is connectable to a feedback network to generate an output voltage of the differential amplifier, and wherein the control circuit is configured to change an output voltage of the differential amplifier.

16. The circuit according to claim 11, wherein gate widths of the transistors of the first series connections are configured differently, and/or wherein gate widths of the transistors of the second series connections are configured differently.

* * * * *